US006197480B1

(12) United States Patent
Iguchi et al.

(10) Patent No.: US 6,197,480 B1
(45) Date of Patent: Mar. 6, 2001

(54) PHOTOSENSITIVE PASTE, A PLASMA DISPLAY, AND A METHOD FOR THE PRODUCTION THEREOF

(75) Inventors: Yuichiro Iguchi; Takaki Masaki; Keiji Iwanaga, all of Shiga (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 08/776,878

(22) PCT Filed: Jun. 12, 1996

(86) PCT No.: PCT/JP96/01596

§ 371 Date: Jul. 21, 1997

§ 102(e) Date: Jul. 21, 1997

(87) PCT Pub. No.: WO96/42035

PCT Pub. Date: Dec. 27, 1996

(30) Foreign Application Priority Data

Jun. 12, 1995 (JP) .................................................. 7-144771
Oct. 12, 1995 (JP) .................................................. 7-264529
Dec. 11, 1995 (JP) .................................................. 7-321793

(51) Int. Cl.$^7$ .............................. G03C 1/725; G03C 1/73; G03C 1/74; G03F 7/213
(52) U.S. Cl. .................................... 430/286.1; 430/270.1; 430/281.1; 430/285.1; 430/287.1; 430/288.1; 430/198; 430/28; 522/71; 522/83
(58) Field of Search ............................. 430/270.1, 281.1, 430/285.1, 286.1, 287.1, 288.1, 198, 28; 522/71, 83

(56) References Cited

U.S. PATENT DOCUMENTS

| | | | |
|---|---|---|---|
| 4,192,795 | * | 3/1980 | Madhavan et al. ............. 260/998.11 |
| 4,503,169 | * | 3/1985 | Randklev ............................ 523/117 |
| 4,613,634 | * | 9/1986 | McKie ................................. 523/223 |
| 5,260,350 | * | 11/1993 | Wright ................................. 522/42 |

FOREIGN PATENT DOCUMENTS

| | | |
|---|---|---|
| 0 234 519 | 9/1987 | (EP) . |
| 0 568 853 | 11/1993 | (EP) . |
| 7-045120 | 2/1995 | (JP) . |

OTHER PUBLICATIONS

Derwent Abstract (Access No. 1995–119 765), English Abstrasct of JP 07045120 A (Publication data Feb. 14, 1995) (From West) 1.2 database).*

* cited by examiner

Primary Examiner—Janet Baxter
Assistant Examiner—Sin J. Lee
(74) Attorney, Agent, or Firm—Morrison & Foerster LLP

(57) ABSTRACT

To provide a photosensitive paste that permits pattern formation with a high aspect ratio and a high accuracy and to provide a plasma display including the photosensitive paste, by using a photosensitive paste that includes, as essential components, an inorganic particles and an organic component that contains a photosensitive compound with the difference between the average refractive index of the organic component and the average refractive index of the inorganic particles being 0.1 or less.

32 Claims, No Drawings

PHOTOSENSITIVE PASTE, A PLASMA DISPLAY, AND A METHOD FOR THE PRODUCTION THEREOF

This application is a national stage application of PCT/JP96/01596, filed Jun. 12, 1996.

TECHNICAL FIELD

The present invention relates to a novel photosensitive paste, a plasma display produced thereof, and a production method thereof.

The photosensitive paste of the present invention is used for pattern formation for various displays, including plasma display and matrix-addressed plasma liquid crystal display, and circuit materials. Such a plasma display can be used in large-size TV sets and computer displays.

BACKGROUND TECHNOLOGY

In the fields of display and circuit material, demands are recently very high for techniques for highly accurate pattern formation with inorganic materials.

As increasingly small, fine-definition products have been developed in the field of display, demands are very high for advanced techniques for accurate pattern formation. For the production of a barrier rib that divides the pixels on the plasma display panel, for example, it has been hoped to develop a material that serves for pattern formation with an inorganic material, such as glass, with a high level of accuracy and a high aspect ratio.

In the field of circuit material, on the other hand, useful techniques have been needed for accurate processing of ceramic substrates on which IC's are to be mounted. Screen printing and punching are currently used for the pattern formation, but more advanced techniques are needed for highly accurate pattern formation as smaller circuit devices are developed.

Conventionally, pattern formation with inorganic material has been frequently performed by screen printing using a paste consisting of inorganic particles and an organic binder, followed by firing. Screen printing, however, is disadvantageous in forming accurate patterns. Another disadvantage is that the formation of a pattern with a high aspect ratio requires many processing steps since multiple-layer printing is necessary.

To solve this problem, U.S. Pat. No. 4,885,963, U.S. Pat. No. 5,209,688, and JP-A-05-342992 have proposed to perform photolithography using a photosensitive paste. Since the photosensitive paste is low in sensitivity and resolution, however, it is impossible to produce a high-definition barrier rib with a high aspect ratio, and therefore, a long process consisting of several steps (coating, exposure, development, etc.) is required to form a pattern on a barrier rib up to a large thickness of, for example, 80 μm or more.

U.S. Pat. No. 5,209,688 has also proposed a method in which transfer paper is coated with a photosensitive paste, followed by transferring transfer film onto a glass substrate, and JP-A-03-57138 has proposed a method in which grooves on a photoresist layer are filled with a dielectric paste to form a barrier rib. Also, U.S. Pat. No. 5,116,271 has proposed the use of photosensitive organic film to form a barrier rib. These methods, however, have disadvantages arising from the use of transfer film, photoresist, or organic film which require additional manufacturing processes. It should also be noted that a high-definition barrier rib with a high aspect ratio has not been obtained with these methods.

Furthermore, manufacturing of plasma displays sometimes requires pattern formation of the insulator layer or dielectric layer in addition to the barrier rib, and results in problems similar to those with the barrier rib processing.

SUMMARY OF THE INVENTION

The object of the invention is to provide a photosensitive paste that permits pattern formation with high accuracy and a high aspect ratio, which is made possible by controlling the refractive index of the organic and inorganic components in the photosensitive paste in order to reduce the reflection and scattering at the interface between the organic and inorganic components. Another object of the invention is to provide a high-definition plasma display and a method for the production thereof.

The objects of the invention are achieved by a photosensitive paste comprising, as essential components, inorganic particles and an organic component that contains a photosensitive compound, wherein the average refractive index of the inorganic particles, N1, and the average refractive index of the photosensitive organic component, N2, meet the following equation:

$$-0.1 \leq N1 - N2 \leq 0.2$$

The objects of the invention are also achieved by a photosensitive paste comprising, as essential components, inorganic particles and an organic component that contains a photosensitive compound, wherein the average refractive index of the inorganic particles is in the range of 1.5–1.7.

Furthermore, the objects of the invention are also achieved by a plasma display and its production method wherein the barrier rib is produced by coating a glass substrate with the paste, followed by exposure, development, and firing.

BEST MODE FOR CARRYING OUT THE INVENTION

The photosensitive paste of the invention comprises inorganic particles and an organic component containing a photosensitive compound, and forms an inorganic pattern when sintered after a pattern is formed by photolithography with the photosensitive organic component.

The content of the inorganic particles in the paste should be in the range of 50–98 wt. %, preferably 50–95 wt. %, more preferably 70–95 wt. %, in order to reduce the shrinkage in the firing process to minimize the deformation caused by the firing.

The present inventors have carried out detailed studies and found that a pattern with a high aspect ratio can be produced easily by reducing the difference between the average refractive index of the organic component and the average refractive index of the inorganic particles to 0.1 or less, more preferably 0.07 or less.

Also, a pattern with a high aspect ratio can be produced accurately by allowing the average refractive index of the inorganic particles in the photosensitive paste, N1, and the average refractive index of the photosensitive organic component, N2, meet the following equation:

$$-0.05 \leq N1 - N2 \leq 0.1$$

more preferably, $$-0.01 \leq N1-N2 \leq 0.07$$

Also, since the organic component can increase in refractive index when polymerized, a pattern with a higher aspect ratio is produced when the following equation is met.

$$0 \leq N1-N2 \leq 0.07$$

A pattern with a higher aspect ratio can be produced when the refractive index of the organic component polymerized by light irradiation, N3, and the refractive index of the inorganic particles, N1, meet the following equation:

$$-0.03 \leq N1-N3 \leq 0.03$$

Any ordinary inorganic material can be used as the inorganic particles. Preferred ones include glass, ceramics (alumina, cordylite, etc.), and metals (gold, platinum, silver, copper, nickel, palladium, tungsten, ruthenium oxide, and alloys thereof). Glass and ceramics containing, as an essential component, an oxide of silicon, an oxide of boron, or an oxide of aluminum are particularly preferred. Being insulators, they can be effectively used for producing patterned insulation materials, including barrier ribs for plasma displays and matrix-addressed plasma liquid crystal displays.

For the diameter of the inorganic particles, a suitable value is selected by considering the shape of the pattern to be formed. For effective pattern formation, however, it is preferable to use inorganic particles with a 50 wt. % particle diameter of 0.1–10 $\mu$m, a 10 wt. % particle diameter of 0.4–2 $\mu$m, and a 90 wt. % particle diameter of 4–10 $\mu$m, and with a specific surface of 0.2–3 $m^2/g$.

The use of spherical inorganic particles permits patterning with a high aspect ratio. Specifically, the sphericity coefficient should preferably be 80% or more. It is more preferred that the average particle diameter, the specific surface, and the sphericity coefficient be 1.5–4 $\mu$m, 0.5–1.5 $m^2/g$, and 90% or more, respectively.

The sphericity coefficient is defined as the proportion of those particles which look spherical or ellipsoidal under a microscope. That is, they are observed as round or elliptical objects under an optical microscope.

A pattern with a more accurate shape can be obtained by using glass particles that are produced by crushing glass that is 50% or more in transmittance (3 mm thick) for light with a wavelength of 436 nm.

To produce a space plate for a plasma display or a matrix-addressed plasma liquid crystal display, glass particles with a thermal softening temperature (Ts) of 350–600° C. should preferably be used at 60 wt. % or more because a pattern has to be formed on a glass substrate with a low thermal softening temperature.

To prevent warping from taking place in the glass substrate during firing, the glass particles used should preferably have a linear thermal expansion coefficient of 50–90× $10^{-7}$, more preferably 60–90× $10^{-7}$.

Concerning the composition of the glass particles, the content of silicon oxide should preferably be in the range of 3–60 wt. %. If it is less than 3 wt. %, the denseness, strength and stability of the glass layer will deteriorate, and the thermal expansion coefficient will be out of the preferred range, possibly causing poor contact with the glass substrate. Furthermore, a content of 60 wt. % or less will lead to a low thermal softening temperature, permitting sintering onto a glass substrate.

When included at up to 5–50 wt. %, boron oxide can act to enhance some electrical, mechanical and thermal characteristics such as electric insulation, strength, thermal expansion coefficient, and denseness of the insulation layer. The glass will deteriorate in stability if the boron oxide content exceeds 50 wt. %.

A glass paste with thermal properties suitable for pattern formation on a glass substrate can be produced by using glass particles that contain at least one of the following: bismuth oxide, lead oxide, lithium oxide, sodium oxide, or potassium oxide, at 5–50 wt. %. If the content exceeds 50 wt. %, the thermal resistance of the glass will deteriorate, making sintering onto the glass substrate difficult. In particular, the use of glass containing bismuth oxide at 5–50 wt. % is advantageous since the pot life of the paste will become long.

Such a glass containing bismuth oxide should preferably contain up to 50 wt. % or more of an oxide mixture with the following composition in terms of oxide contents:

bismuth oxide: 5–50 wt. %
silicon oxide: 3–60 wt. %
boron oxide: 5–50 wt. %

Glass material that is usually used as insulation material has a refractive index in the range of 1.5–1.9. If the average refractive index of the organic component is largely different from the average refractive index of the inorganic particles, strong reflection and scattering will occur at the interface between the inorganic particles and the photosensitive organic component, leading to failure in producing a high-definition pattern. Since a typical organic compound has a refractive index of 1.45–1.7, the inorganic particles and the organic component can be matched in terms of refractive index if the inorganic particles have a refractive index of 1.5–1.7. More preferably, the latter should be in the range of 1.55–1.65 to permit an organic component to be selected from a wide choice.

The use of glass particles containing oxides of alkali metals, such as lithium oxide, sodium oxide, and potassium oxide, at 3–20 wt. % in total not only facilitates the control of the thermal softening temperature and thermal expansion coefficient, but also reduces the average refractive index of glass, allowing the difference in refractive index between the glass particles and the organic component to be decreased easily. To increase the stability of the paste, the content of the oxide of alkali metals should preferably be 20 wt. % or less, more preferably 15 wt. % or less.

In particular, of the various alkali metals, the use of lithium oxide can increase the stability of the paste to a relatively high level, and potassium oxide, even when added in small amounts, can serve to control the refractive index. Thus, among other alkali metals, lithium oxide and potassium oxide can work very effectively.

As a result, it becomes easy to provide inorganic particles that have a thermal softening temperature suitable for sintering onto a glass substrate and an average refractive index of 1.5–1.7 which permits a decreased difference in refractive indices of the inorganic particles and the organic component.

Glass containing lead oxide or bismuth may be preferred because they can increase the thermal softening temperature and water resistance. However, glass particles containing lead oxide and/or bismuth at 10 wt. % or more may often have a refractive index of more than 1.6. Thus, the combined use of alkali metal oxides, such as lithium oxide, sodium oxide, and potassium oxide, with lead oxide and/or bismuth oxide can facilitate the control of the thermal softening temperature, thermal expansion coefficient, water resistance, and refractive index.

The hardness and workability of glass particles can be improved by adding aluminum oxide, barium oxide, calcium oxide, magnesium oxide, titanium oxide, zinc oxide, and/or zirconium oxide. In particular, aluminum oxide, barium oxide, and zinc oxide are effective. To maintain a required thermal softening temperature, thermal expansion coefficient, and refractive index, their respective content should preferably be 40 wt. % or less, more preferably 30 wt. % or less, with their total content being 50 wt. % or less.

The shrinkage that may occur during firing can be controlled by adding to the paste of the invention glass particles or ceramic particles with a thermal softening temperature of 600–900° C. and an aluminum oxide, barium oxide, calcium oxide, magnesium oxide, titanium oxide, zinc oxide, and/or zirconium oxide content of 40 wt. % or less. To ensure high-accuracy pattern formation, the difference in refractive index among the particles used should preferably be 0.1 or less, more preferably 0.05 or less.

As for circuit materials, particularly for materials for multiple-layer substrates, ceramics as well as glass can be used as substrate material. Thus the thermal softening temperature may not necessarily be 600° C. or less, so a high-strength substrate can be produced by using material with an aluminum oxide content of 25–75 wt. %.

The Becke method can be used to measure the refractive index of inorganic particles used for the present invention. To ensure high accuracy, measurement should be carried out at a wave length equal to that of the light used for exposure that is performed after the coating with the paste. In particular, measurement should preferably be conducted by using light with a wave length in the range of 350–650 nm. It is further preferred that refractive index be measured with i-ray (365 nm) or g-ray (436 nm).

A colored pattern can be obtained after firing by adding various metal oxides. For example, a black pattern can be produced by adding black metal oxides to the photosensitive paste up to a content of 1–10 wt. %.

In selecting black metal oxides to be used to produce such a black pattern, at least one, preferably three or more, of the following group of oxides should be used: Cr, Fe, Co, Mn, and Cu. In particular, a highly black pattern can be obtained by adding Fe and Mn, each up to 0.5 wt. % or more.

Further, patterns of various other colors other than black can be produced by employing a paste containing inorganic pigments that can cause coloring in red, blue, green, etc. Such colored patterns can be effectively used in such products as color filters for plasma display.

Particles used for the invention can be a mixture of several sets of particles with different compositions. In particular, the shrinkage caused during firing can be controlled by using several sets of glass particles and ceramic particles with different thermal softening temperatures.

To ensure high-accuracy pattern formation, however, the difference in refractive index among the several sets of inorganic particles with different compositions used in this case should preferably be 0.1 or less, more preferably 0.05 or less.

The organic component used in the present invention as stated herein refers to the organic component of the paste that contains the photosensitive organic material (i.e., the remainder that is obtained after removing the inorganic components from the paste).

The organic component may contain:
(a) 10–90 wt. % of an oligomer or a polymer having a weight-average molecular weight of 500–100,000, which oligomer or polymer has a carboxyl group, an unsaturated double bond or both in its molecular structure;

(b) 10–80 wt. % of a multifunctional acrylate compound and/or methacrylate compound; or (c) at least one moiety selected from the group consisting of benzene ring, naphthalene ring and sulfur atom with a total content of 10–60 wt. %.

To ensure a high degree of photosensitivity, the photosensitive component in a photosensitive paste as used in the invention should preferably account for 10 wt. % or more, more preferably 30 wt. % or more, of the organic component.

The organic component should contain at least one of the following photosensitive materials: photosensitive monomers, photosensitive oligomers, and photosensitive polymers. In addition, it may contain, as necessary, such additives as binders, photopolymerization initiators, ultraviolet ray absorbents, sensitizers, sensitization assistants, polymerization inhibitors, plasticizers, viscosity improvers, organic solvents, antioxidants, dispersing agents, organic or inorganic suspending agents, and leveling agents.

There are photo-insolubilizing type and photo-solubilizing type photosensitive materials. A photo-insolubilizing type photosensitive material may contain:

(A) functional monomers, oligomers, or polymers that have one or more unsaturated groups in each molecule, (B) a photosensitive compound such as an aromatic diazo compound, an aromatic azide compound, or an organic halogen compound, or (C) a so-called diazo resin such as a condensation product of diazotized amine and formaldehyde.

A photo-solubilizing type photosensitive material may contain:

(D) a complex of an inorganic salt of a diazo compound and a organic acid, a quinonediazo compound, etc., or (E) a product of a quinonediazo compound bonded with a polymer binder, such as naphthoquinone-1,2-diazide-5-sulfonate of phenol or novolak resin.

Any of the photosensitive components listed above can be used for the present invention. In particular, those specified under (A) are preferred as a component of a photosensitive paste because they can be used conveniently in combination with inorganic particles.

The useful photosensitive monomers include compounds with an unsaturated carbon-carbon bond, such as methylacrylate, ethylacrylate, n-propylacrylate, isopropylacrylate, n-butylacrylate, sec-butylacrylate, sec-butylacrylate, iso-butylacrylate, tert-butylacrylate, n-pentylacrylate, allylacrylate, benzilacrylate, butoxyethylacrylate, butoxytriethylene glycolacrylate, cyclohexylacrylate, dicyclopentanylacrylate, dicyclopentenylacrylate, 2-ethylhexylacrylate, glycerolacrylate, glycidylacrylate, heptadecafluorodecylacrylate, 2-hydroxyethylacrylate, isobonylacrylate, 2-hydroxypropylacrylate, isothexylacrylate, isooctylacrylate, laurylacrylate, 2-methoxyethylacrylate, methoxyethylene glycolacrylate, methoxydiethylene glycolacrylate, octafluoropentylacrylate, phenoxyethylacrylate, stearylacrylate, trifluoroethylacrylate, allylated cyclohexyldiacrylate, 1,4-butanedioldiacrylate, 1,3-butylene glycoldiacrylate, ethylene glycoldiacrylate, diethylene glycoldiacrylate, triethylene glycoldiacrylate, polyethylene glycoldiacrylate, dipentaerythritol hexaacrylate, dipentaerythritol monohydroxypentaacrylate, ditrimethylol propanetetraacrylate, glycerol diacrylate, methoxylated cyclohexyldiacrylate, neopentyl glycoldiacrylate, propylene glycoldiacrylate, polypropylene glycoldiacrylate, triglycerol diacrylate, trimethylol propanetriacrylate, acryl amide, aminoethylacrylate, phenylacrylate, phenoxyethylacrylate, benzilacrylate, 1-naphthylacrylate, 2-naphthylacrylate, bisphenol-A-diacrylate, a diacrylate of an addition product of bisphenol-A-ethyleneoxid, a diacrylate of an addition product of bisphenol-A-propyleneoxide, thiophenolacrylate, and benzilmercaptanacrylate; monomers formed by replacing 1–5 of the hydrogen atoms in the aromatic ring of the above compounds with chlorine or bromine atoms; styrene, p-methylstyrene, o-methylstyrene, m-methylstyrene, chlorinated styrene, brominated styrene, α-methylstyrene, chlorinated α-methylstyrene, brominated α-methylstyrene, chloromethylstyrene, hydroxymethylstyrene, carboxymethylstyrene, vinylnaphthalene, vinylanthracene, and vinylcarbazole; above-mentioned acrylates with one or all acrylate parts replaced with methacrylate parts; γ-methacryloxypropyl trimethoxysilane, and 1-vinyl-2-pyrolidone. For the purposes of the present invention, these compounds can be used alone or in combination.

In addition to these, an unsaturated acid such as an unsaturated carboxylic acid may be added to improve the developing performance after light irradiation. Such unsaturated carboxylic acids include acrylic acid, methacrylic acid, itaconic acid, crotonic acid, maleic acid, fumaric acid, vinylacetic acid, and anhydrides of these acids.

The useful binders include polyvinyl alcohol, polyvinylbutyral, methacrylate polymers, acrylate polymers, acrylate-mathacrylate co-polymers, α-methylstyrene polymers, and butylmathacrylate resins.

Further, oligomers and polymers that are produced by polymerizing at least one of said compounds having a carbon-carbon bond can also be used.

In polymerizing them, these monomers may be copolymerized with other photosensitive monomers in such a way that the content of the former is 10 wt. % or more, more preferably 35 wt. % or more.

The developing performance after light irradiation can be improved by using an unsaturated acid such as an unsaturated carboxylic acid as the monomer for copolymerization. Useful unsaturated carboxylic acids include acrylic acid, methacrylic acid, itaconic acid, crotonic acid, maleic acid, fumaric acid, vinylacetic acid, and anhydrides of these acids.

The resultant polymers or oligomers having acid groups such as carboxyl group in their side chains should preferably have an acid value in the range of 50–180, more preferably 70–140. The developable range will be narrow if the acid value is less than 50. If the acid value exceeds 180, on the other hand, the unexposed portions will be small in solubility to the developing solution, but the use of a developing solution with an increased concentration will cause the removal of exposed portions, making it difficult to produce high-definition patterns.

Useful photosensitive polymers or photosensitive oligomers can be produced by adding photosensitive groups to the side chains or the molecular ends of the polymers or oligomers listed above.

Photosensitive groups having an ethylenically unsaturated group are preferred. Such ethylenically unsaturated groups include vinyl, allyl, acryl, and methacryl.

The addition of such side chains to oligomers or polymers can be carried out by allowing a glycidyl- or isocyanate-containing ethylenically unsaturated compound, acrylic acid chloride, methacrylic acid chloride or allylchloride to undergo addition reaction with the mercapto group, amino group, hydroxyl group, or carboxyl group in the polymers.

Such ethylenically unsaturated compounds with glycidyl groups include glycidyl acrylate, glycidyl methacrylate, allylglycidyl ethers, glycidyl ethylacrylate, crotonic glycidyl ethers, iso crotonic glycidyl ethers.

Useful ethylenically unsaturated compounds with isocyanate groups include (meth)acryloyl isocyanate, and (meth) acryloyl ethylisocyanate.

Such aglycidyl- or isocyanate-containing ethylenically unsaturated compound, acrylated chloride, methacrylated chloride, and allyl chloride should preferably be added to 0.05–1 equivalent to the mercapto, amino, hydroxy, or carboxy group in the polymer.

Useful photopolymerization initiators include benzophenone, o-methyl benzoylbenzoate, 4,4-bis (dimethylamine)benzophenone, 4,4-bis(diethylamino) benzophenone, 4,4-dichlorobenzophenone, 4-benzoyl-4-methyldiphenylketone, dibenzilketone, fluorenone, 2,2-diethoxyacetophenon, 2,2-dimethoxy-2-phenyl-2-phenylacetophenon, 2-hydroxy-2-methylpropiophenon, p-t-butyldichloroacetophenon, thioxanthone, 2-methylthioxanthone, 2-chlorothioxanthone, 2-isopropylthioxanthone, diethylthioxanthone, benzil, benzildimethyl ketanol, benzilmethoxyethyl acetal, benzoin, benzoinmethyl ether, benzoinbutyl ether, anthraquinone, 2-t-butylanthraquinone, 2-amylanthraquinone, β-chloroanthraquinone, anthrone, benzanthrone, dibenzosuberone, methyleneanthrone, 4-azidebenzalacetophenon, 2,6-bis(p-azidebenzylidene) cyclohexanone, 2,6-bis(p-azidebenzylidene)-4-methylcyclohexanone, 2-phenyl-1,2-butadione-2-(o-methoxycarbonyl)oxime, 1-phenyl-propanedione-2-(o-ethoxycarbonyl)oxime, 1,3-diphenyl-propanetrione-2-(o-ethoxycarbonyl)oxime, 1-phenyl-3-ethoxy-propanetrione-2-(o-benzoyl)oxime, Michler's ketone, 2-methyl-[4-(methylthio)phenyl]-2-morpholino-1-propanone, naphthalenesulfonylchloride, quinolinesulfonylchloride, N-phenylthioacridone, 4,4-azobisisobutyronitril, diphenyldisulfide, benzthiazoledisulfide, triphenylphosphine, camphorquinone, carbon tetrabromide, tribromophenylsulfone, and benzoin peroxide; and combinations of such photoreducing pigments as eosin and methylene blue with reducing agents such as ascorbic acid and triethanolamine. For the purposes of the invention, one or more of these can be used in combination. A photopolymerization initiator should preferably be added to 0.05–10 wt. %, more preferably 0.1–5 wt. %, of the photosensitive component. Photosensitivity can be insufficient if the amount of the polymerization initiator added is too small, while the persistence rate of the exposed portions can be too small if the amount of the polymerization initiator added is too large.

The addition of an ultraviolet ray absorbent can be effective. A high aspect ratio, high definition, and high resolution may be achieved by adding a compound with high ultraviolet ray absorbing performance. The preferred ultraviolet ray absorbents include organic dyes and organic pigments, particularly red organic pigments that absorb ultraviolet ray in the wavelength range of 350–450 nm. Specifically, they include azo dyes, aminoketone dyes, xanthene dyes, quinoline dyes, aminoketone dyes, anthraquinone dyes, benzophenone dyes, diphenylcyanoacrylate dyes, triazine dyes, and p-aminobenzoic acid dyes. Organic dyes are preferred because even when added as light absorbers, they will not remain in the fired insulation film, minimizing the deterioration in the performance of the insulation film. Of the dyes listed above, azo dyes and benzophenone dyes are particularly preferred. The content of such an organic dye should preferably be 0.05–5 parts by weight. The effect of the ultraviolet ray absorbent will not be sufficient if the content is less than 0.05 wt. %, while the performance of the fired insulation film will not be sufficient if the content is above 5 wt. %. It is more preferred that the content be in the range of 0.05–1 wt. %. A typical process of adding an ultraviolet ray absorbent comprising an organic dye is as follows: the organic dye is dissolved in an organic solvent to form a solution, followed either by kneading it into a paste, or by adding inorganic particles to the organic solvent and drying it. By the latter method, so-called encapsulated particles in which the surface of each organic particle is coated with the organic compound are produced.

In some embodiments of the invention, such metals as Pb, Fe, Cd, Mn, Co, and Mg or their oxides contained in the inorganic particles may react with the photosensitive component of the paste to cause quick gelation of the paste, making it impossible to use it for coating. To prevent such a reaction, it is preferred that a stabilizing agent be added to inhibit the gelation. Preferred stabilizing agents include triazole compounds. In particular, preferred triazole compounds include benzotriazole derivatives, of which benzotriazole can work effectively. A typical surface treatment of glass particles with benzotriazole as performed for the invention is as follows: a required amount benzotriazole relative to the amount of inorganic particles is dissolved in an organic solvent such as methyl acetate, ethyl acetate, ethyl alcohol, or methyl alcohol, and the particles are immersed in the solution for 1–24 hours to ensure adequate immersion, followed by air drying preferably at a temperature of 20–30° C. to evaporate the solvent, thus producing triazole-treated particles. The amount of the stabilizing agent used (stabilizing agent/inorganic particles) should preferably be 0.05–5 wt. %.

A sensitizer is added to improve the sensitivity. Specifically, such sensitizers include 2,4-diethylthioxanthone, isopropylthioxanthone, 2,3-bis(4-diethylaminobenzal)cyclopentanone, 2,6-bis(4-dimethylaminobenzal)cyclohexanone, 2,6-bis(4-dimethylaminobenzal)-4-methylcyclohexanone, Michler's ketone, 4,4-bis(diethylamino)-benzophenone, 4,4-bis(dimethylamino)chalcone, 4,4-bis(diethylamino)chalcone, p-dimethylaminocinnamylideneindanone, p-dimethylaminobenzylideneindanone, 2-(p-dimethylaminophenylvinylene)-isonaphthothiazole, 1,3-bis(4-dimethylaminobenzal)acetone, 1,3-carbonyl-bis(4-diethylaminobenzal)acetone, 3,3-carbonyl-bis(7-diethylaminocoumalin), N-phenyl-N-ethylethanolamine, N-phenylethanolamine, N-tolyldiethanolamine, N-phenylethanolamine, dimethylaminoisoamyl benzoate, diethylaminoisoamyl benzoate, 3-phenyl-5-benzoylthiotetrazole, and 1-phenyl-5-ethoxycarbonylthiotetrazole. One or more of these can be used for the purposes of the invention. Some sensitizers can also work as phoptopolymerization initiators. When a sensitizer is added to a photosensitive paste as used for the invention, its content should preferably be 0.05–10 wt. %, more preferably 0.1–10 wt. %, relative to the photosensitive component. The sensitivity to light may not be improved significantly if the amount of the sensitizer is too small, while the persistence rate of the exposed portions can be too small if the amount of the sensitizer is too large.

A polymerization inhibitor is added to improve the thermal stability during storage. Specifically, such polymerization inhibitors include hydroquinone, monoesterified compounds of hydroquinone, N-nitrosodiphenylamine, phenothiazine, p-t-butylcatechol, N-phenylnaphthylamine, 2,6-di-t-butyl-p-methylphenol, chloranil, and pyrogallol. When a polymerization inhibitor is added, its content should preferably be 0.001–1 wt. % of the photosensitive paste.

Useful plasticizers include dibutylphthalate, dioctylphthalate, polyethylene glycol, and glycerin.

An antioxidant is added to prevent the oxidation of an acrylate co-polymer during storage. Specifically, such antioxidants include 2,6-di-t-butyl-p-cresol, butylated hydroxyanisole, 2,6-di-t-4-ethylphenol, 2,2-methylene-bis-(4-methyl-6-t-butylphenol), 2,2-methylene-bis-(4-ethyl-6-t-butylphenol), 4,4-bis-(3-methyl-6-t-butylphenol), 1,1,3-tris-(2-methyl-6-t-butylphenol), 1,1,3-tris-(2-methyl-4-hydroxy-t-butylphenyl)butane, bis [3,3-bis-(4-hydroxy-3-t-butylphenyl)butyric acid] glycol esters, dilaurylthiodipropionate, and triphenylphosphite. When an antioxidant is added, its content should preferably be 0.001–1 wt. % of the paste.

When the viscosity of the solution is to be controlled, an organic solvent may be added to the photosensitive paste of the invention. The useful organic solvents for this include methylcellosolve, ethylcellosolve, butylcellosolve, methylethylketone, dioxane, acetone, cyclohexanone, cyclopentanone, isobutyl alcohol, isopropyl alcohol, tetrahydrofuran, dimethylsulfoxide, γ-butyrolactone, bromobenzene, chlorobenzene, dibromobenzene, dichlorobenzene, bromobenzoate, chlorobenzoate, and mixtures of organic solvents containing one or more of them.

The refractive index of the organic component is defined as the refractive index of that organic component in the paste at the time of exposure of the photosensitive component to light. When exposure is to be performed after the paste-coating and drying processes, the refractive index is defined as the refractive index of the organic compound in the paste after the drying process. In a typical method, the glass substrate is coated with a paste and then dried at 50–100° C. for 1–30 min, followed by the measurement of the refractive index.

For the purposes of the present invention, common refractive index measurement methods such as the ellipsometric method or the V block method are preferred, and the measurement should be performed at the same wavelength as that of the light used for the exposure. In particular, measurement should preferably be carried out using light with a wavelength in the range of 350–650 nm. Further, measurement of the refractive index should preferably be performed by using i-ray (365 nm) or g-ray (436 nm).

The refractive index of the organic component polymerized by light irradiation can be measured by irradiating only the organic component with the same light as that used for the light irradiation of the paste.

Glass particles containing 10 wt. % or more bismuth oxide or lead oxide that can be fired onto a glass substrate can have a refractive index of 1.6 or more, and in such a case, the organic compound should have a high refractive index.

In such a case, a substance with a high refractive index should be added to the organic component. To increase the refractive index, the addition of a compound that contains sulfur atoms, bromine atoms, iodine atoms, naphthalene rings, biphenyl rings, anthracene rings, or carbazole rings at 10 wt. % or more to the organic component is effective. The refractive index can also be increased by adding benzene rings at up to 20 wt. %.

In particular, the refractive index of the organic component can be easily increased by adding more than 10 wt. % of sulfur atoms or naphthalene rings. If the content is 60 wt. % or more, however, the sensitivity to light may decrease undesirably, so the total content of the sulfur atoms and naphthalene rings should preferably be in the range of 10–60 wt. %.

An effective method for introducing sulfur atoms, bromine atoms, and naphthalene rings into the organic component is the use of a compound consisting of photosensitive monomers or binders that contain sulfur atoms or naphthalene rings. Typical polymers produced from monomers containing sulfur atoms in their molecular structure include those expressed by formulae (a), (b) and (c) below, where R in the structural formulae denotes a hydrogen atom or a methyl group.

treatment include silane coupling agents, such as vinyl trichlorosilane, vinyl trimethoxy silane, vinyl triethoxy silane, tris-(2-methoxyethoxy)vinyl silane, γ-glycidoxypropyl trimethoxy silane, γ-(methacryloxypropyl)trimethoxy silane, γ(2-aminoethyl) aminopropyl trimethoxy silane, γ-chloropropyl trimethoxy silane, γ-mercaptopropyl trimethoxy silane, and γ-aminopropyl triethoxy silane; and organic metal compounds such as organic titanium compounds, organic aluminum compounds, and organic zirconium compounds. Such silane coupling agents or organic metal compounds are used as a 0.1–5% solution in such an organic solvent as ethylene glycol monomethyl ether, ethylene glycol mono-

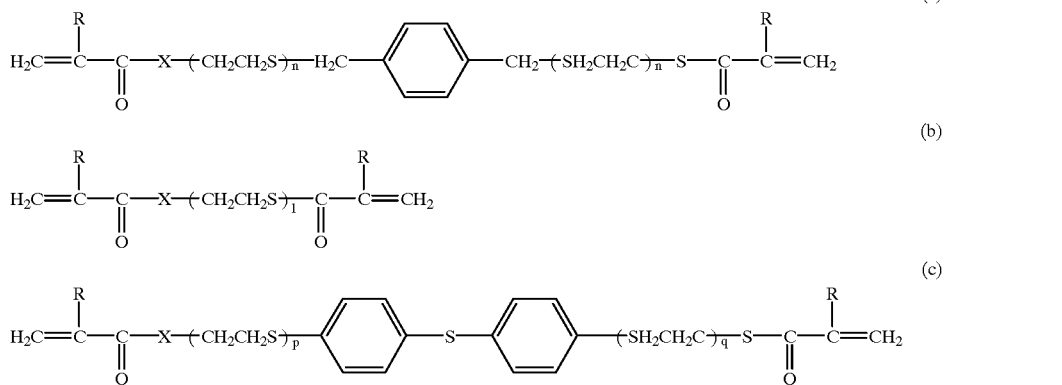

A sensitizer to be used should absorb light of the exposure wavelength. With such a sensitizer, the refractive index extremely increases in the vicinity of the wavelength where absorption occurs, so the refractive index of the organic component can be increased by adding a sensitizer in large amounts. In such a case, the sensitizer can be added at 0.5–10 wt. %, more preferably 1–6 wt. %, of the paste.

To produce a paste, the required components such as inorganic particles, ultraviolet ray absorbent, photosensitive polymer, photosensitive monomer, photopolymerization initiator, glass frit, and solvent are prepared to provide a mixture of a required composition, followed by processing by means of a three-roll mill or a kneading machine to ensure homogeneous mixing and dispersion.

The viscosity of the paste is adjusted, as required, by controlling the amounts of the inorganic particles, viscosity improver, organic solvent, plasticizer, and suspending agent to be added. Its range should be 2,000–200,000 cps (centipoise). When the spin coating method is used to coat glass substrates, the viscosity should preferably be 200–5,000 cps. It should preferably be 50,000–200,000 cps when the screen printing method is used to apply a single coat with a thickness of 10–20 μm, while it should preferably be 1,000–20,000 cps when a blade coater or a dye coater is used.

Some examples of using photosensitive pastes for pattern formation are described below, but they should place no limitations on the invention.

A photosensitive paste is applied over the entire surface or a part of a glass substrate, a ceramic substrate, or a polymer film. A common method such as screen printing, bar coater, roll coater, dye coater, or blade coater can be used for the coating. The coat thickness can be adjusted by using an appropriate number of coats, coater gap, screen mesh, and past viscosity.

When a paste is applied over a substrate, the surface of the substrate may be treated to achieve a close contact between the substrate and coat. Useful agents for such surface ethyl ether, methyl alcohol, ethyl alcohol, propyl alcohol, and butyl alcohol. Then, the surface treatment liquid is applied uniformly over a substrate by means of a spinner etc., followed by drying at 80–140° C. for 10–60 min to achieve surface treatment.

When a paste is applied to a film, the exposure may be performed either after drying the paste on the film, or after adhering the film on a glass or ceramic substrate.

A photosensitive green sheet for circuit materials or displays can be produced by applying the photosensitive paste of the invention over such materials as polyester film. A photosensitive paste layer with a uniform thickness can be produced by transferring this green sheet onto a glass substrate.

After the coating, light exposing equipment is used to perform exposure. Exposure is generally carried out with the masked exposure method using a photomask, as in ordinary photolithography. The mask used may be of a negative type or a positive type depending on the photosensitive organic component.

Direct pattern formation by means of a red or blue visible laser beam or Ar ion laser beam may be performed instead of using a photomask.

Exposure devices such as stepper exposer or proximity exposer may be used. For light exposure of a large area, a photosensitive paste may be applied over a glass or other substrate, followed by performing exposure while conveying the substrate to allow a large area to be exposed by means of a light exposer with a small light source.

The active light sources that can be used effectively include visible light, near ultraviolet light, ultraviolet light, electron beam, X-ray, and laser beam. Of these, ultraviolet light is preferred, and such sources as low-pressure mercury lamp, high-pressure mercury lamp, extra-high pressure mercury lamp, halogen lamp, and germicidal lamp can be used. Of these, the extra-high pressure mercury lamp is preferred. The optimum exposure conditions depend on the coat thickness, but an extra-high pressure mercury lamp with an output of 1–100 mW/cm$^2$ should preferably be used for exposure for 0.5–30 min.

Oxygen barrier film may be provided over the applied photosensitive paste to improve the shape of the pattern. Useful materials for such oxygen barriers include PVA membrane, cellulose membrane, and polyester film.

PVA membrane may be produced by coating a substrate uniformly with 0.5–5.0 wt. % aqueous solution using a spinner etc., followed by drying at 70–90° C. for 10–60 min to evaporate water. It is preferred that a small amount of alcohol be added to the aqueous solution to improve the wettability with the insulation film, thus facilitating the evaporation. The PVA solution should more preferably be in the concentration range of 1–3 wt. %. A concentration in this range will further improve the sensitivity. It is thought that the PVA coating can improve the sensitivity because of the following mechanism: oxygen in the atmosphere is believed to reduce the sensitivity for photo-curing, but the PVA membrane can block undesirable oxygen to improve the sensitivity to light exposure.

When transparent films such as polyester, polypropylene, or polyethylene are used, such film may be adhered over the applied photosensitive paste.

After the light exposure, development is carried out by making use of the difference in solubility to developing solution between the exposed and unexposed portions. Such a method as dipping, spraying, or brushing may be used for this purpose.

An organic solvent that can dissolve the organic component in the photosensitive paste can be used for the development solution. Water may be added to the organic solvent as long as its dissolving power is not reduced significantly. Alkaline aqueous solution may be used when the photosensitive paste contains a compound with an acid group such as carboxyl. Although the alkaline aqueous solution can be a metallic alkaline solution such as sodium hydroxide solution, sodium carbonate solution, or calcium hydroxide solution, the use of an organic alkaline solution is preferred because the alkaline components can be removed easily at the time of firing.

Common amine compounds can be used as such organic alkaline compounds. Specifically, they include tetramethylammonium hydroxide, trimethylbenzylammonium hydroxide, monoethanol amine, and diethanol amine. The concentration of said alkaline solution should generally be 0.01–10 wt. %, more preferably 0.1–5 wt. %. The soluble portions will not be removed if the alkali concentration is too low, while an excessively high alkali concentration will cause peeling of patterned portions and corrosion of soluble portions.

At the time of development, the developing temperature should preferably be 20–50° C. to facilitate process control.

Firing is then performed in a kiln. The atmosphere and temperature used for the firing depend on the paste and substrate. Firing is generally performed in an atmosphere such as air, nitrogen, or hydrogen. The kiln to be used may be a batch-type kiln or a belt-type continuous kiln.

The firing temperature should be 400–1,000° C. When pattern formation is performed on a glass substrate, it should be maintained at 520–610° C. for 10–60 min to ensure firing.

Each of the processes for coating, light exposure, development, and firing may include a heating step at 50–300° C. for such purposes as drying and preliminary reaction.

A glass substrate with a space plate as produced by the above processes may be used at the front or rear of a plasma display. It may also be used as the substrate provided for electric discharge from the addressed portions in a matrix-addressed plasma liquid crystal display.

Phosphor is applied between the barrier ribs produced above, followed by sandwiching them between a front and a rear glass substrate, and sealing them up with such a rare gas as helium, neon, or xenon, to produce a panel for plasma display.

Then, driver ICs are installed to complete the plasma display.

The size of each pixel has to be reduced to enhance the definition of the plasma display, i.e., to increase the number of pixels in a display of the same size. The pitch of the barrier rib has to be reduced to achieve this, but a decreased pitch will cause a decrease in the discharge space and a decrease in the phosphor-coated area, resulting in a reduced brightness. Specifically, a 42-in. high-resolution display for TV (1920×1035 pixels) or a 23-in. display for office-automation equipment (XGA: 1024×768 pixels) will require a 450×450 µm pixel size and a 150 µm pitch for the barrier rib to divide pixels of each color. In this case, a large line width in the barrier rib will make it impossible to maintain a sufficient discharge space and decrease the phosphor-coated area, thus making it difficult to improve the brightness.

The present inventors have found that the technology given in the present invention serves to reduce the line width in the barrier rib.

In particular, the technology serves to produce a plasma display comprising a stripe-type barrier rib with a spacer width of 20–40 µm. Thus the technology is effective for improving the brightness.

Further, by producing a high-definition barrier rib with a height of 100–170 µm and a pitch of 100–160 µm, a high-definition plasma display useful for high-resolution TVs and computer displays can be provided.

Examples are given below to illustrate the invention more concretely. The examples, however, are not intended to place any limitations on the invention. The concentrations (%) in examples and comparative examples are in percentage by weight unless otherwise specified.

A photosensitive paste containing inorganic particles and an organic component is produced in each example. Its production process is as follows: the materials of the organic component are heated at 80° C. with γ-butyrolactone to ensure dissolution, followed by adding inorganic particles and kneading them in a kneading machine to produce a paste. Its viscosity was adjusted by controlling the amount of the solvent added. The solvent (γ-butyrolactone) was added to 10–40% of the paste.

Subsequently, several coats were applied by screen printing on a 30×30 cm soda-lime glass or quartz glass substrate at a thickness of 100 µm, 150 µm, or 200 µm, followed by drying at 80° C. for 30 min.

Then, the substrates were exposed to light through either of the two photo-masks listed below.

(1) Chromium negative mask with a pitch of 220 µm and a line width of 50 µm (2) Chromium negative mask with a pitch of 150 µm and a line width of 20 µm Light exposure was performed with 2–10 J/cm² of ultraviolet ray from a extra-high pressure mercury lamp with an output of 50 mW/cm².

Subsequently, the substrate was immersed in a 0.5% solution of monoethanol amine for development.

The resultant glass substrate was then dried at 80° C. for one hour, and fired at a maximum temperature of 560° C. or 850° C. (maximum temperature maintained for 30 min).

The resultant substrate was cut into specimens and their cross-sections were observed under a scanning electron microscope to determine whether a good pattern had been produced on the barrier rib. Results are shown in Table 3, where "◯" indicates that a good pattern was produced and "×" indicates that a good barrier rib was not obtained due to missing/destroyed portions in the pattern or due to insufficient development that left unexposed portions unremoved.

The refractive index of the organic component was adjusted only by controlling the organic component in the paste, and it was measured after coating and drying with the ellipsometric method using light with a wavelength of 436 nm at 25° C.

EXAMPLE 1

A paste was prepared from 75 g of powdered glass A1 and 25 g of organic component B3 given in Table 1, using 10 g of solvent.

A pattern was formed and firing was performed at 560° C. for 30 min. Results are shown in Table 3.

Using a photosensitive silver paste, stripe-like 3,072 silver wiring lines with a line width of 40 μm, a pitch of 150 μm, and thickness of 10 μm were produced over a 360×500 mm soda-lime glass substrate (2.8 mm thick). The paste produced above was then applied over the entire area up to a thickness of 200 μm, and exposed to light through a photo-mask with a pitch of 150 μm, line width of 20 μm, total number of 3,080 lines, and line length of 350 mm, followed by development and firing to provide a barrier rib. Subsequently, RGB phosphor pastes were spread by screen printing, followed by firing at 450° C. for 20 min to provide a rear panel for 23-in. plasma display. A 23-in. XGA (1024×768 pixels) can be produced by bonding this rear panel to a front panel and sealing them up with a gas filled between them.

EXAMPLE 2

A paste was prepared from 75 g of powdered glass A2 and 25 g of organic component B3 given in Table 1, using 15 g of solvent.

A pattern was formed and firing was performed at 560° C. for 10 min. Results are shown in Table 3.

EXAMPLE 3

A paste was prepared from 70 g of powdered glass A3 and 30 g of organic component B4 given in Table 1, using 15 g of solvent.

A pattern was formed and firing was performed at 560° C. for 10 min. Results are shown in Table 3.

EXAMPLE 4

A paste was prepared from 80 g of powdered glass A4 and 20 g of organic component B4 given in Table 1, using 7 g of solvent.

A pattern was formed and firing was performed at 580° C. for 15 min. Results are shown in Table 3.

EXAMPLE 5

A paste was prepared from 80 g of powdered glass A4 and 20 g of organic component B2 given in Table 1, using 11 g of solvent.

A pattern was formed and firing was performed at 580° C. for 15 min. Results are shown in Table 3.

EXAMPLE 6

A paste was prepared from 75 g of powdered glass A5 and 25 g of organic component B1 given in Table 1, using 12 g of solvent.

A pattern was formed and firing was performed at 580° C. for 15 min. Results are shown in Table 3.

EXAMPLE 7

A paste was prepared from 75 g of powdered glass A6 and 25 g of organic component B3 given in Table 1, using 10 g of solvent.

A pattern was formed and firing was performed at 850° C. for 15 min. Results are shown in Table 3.

EXAMPLE 8

A paste was prepared by mixing 60 g of powdered glass A1 and 15 g of powdered glass A6 and using 25 g of organic component B3 given in Table 1, using 10 g of solvent.

A pattern was formed and firing was performed at 580° C. 30 min. Results are shown in Table 3.

COMPARATIVE EXAMPLE 1

A paste was prepared from 75 g of powdered glass A3 and 25 g of organic component B2 given in Table 1, using 10 g of solvent.

A pattern was formed and firing was performed at 560° C. for 10 min. Results are shown in Table 3.

COMPARATIVE EXAMPLE 2

A paste was prepared from 75 g of powdered glass A4 and 25 g of organic component B4 given in Table 1, using 10 g of solvent.

A pattern was formed and firing was performed at 580° C. for 15 min. Results are shown in Table 3.

TABLE 1

Compositions of glass particles used

| Component | A1 | A2 | A3 | A4 | A5 | A6 |
|---|---|---|---|---|---|---|
| $Li_2O$ | 9 | 13 | 2 | 0 | 3 | 3 |
| $K_2O$ | 0 | 0 | 11 | 0 | 0 | 0 |
| $SiO_2$ | 22 | 47 | 47 | 13 | 7 | 38 |
| $B_2O_3$ | 33 | 21 | 21 | 18 | 44 | 10 |
| $Bi_2O_3$ | 0 | 0 | 0 | 26 | 26 | 0 |
| BaO | 4 | 5 | 5 | 14 | 17 | 5 |
| $Al_2O_3$ | 23 | 8 | 8 | 4 | 3 | 35 |
| ZnO | 2 | 6 | 6 | 21 | 0 | 5 |
| MgO | 7 | 0 | 0 | 0 | 0 | 0 |
| CaO | 0 | 0 | 0 | 0 | 0 | 4 |
| Glass transition temperature Tg (° C.) | 484 | 469 | 473 | 486 | 492 | 656 |
| Thermal softening temperature Ts (° C.) | 524 | 511 | 520 | 538 | 533 | 800 |
| Sphericity coefficient (%) | 93 | 98 | 94 | 92 | 90 | 90 |
| D50 average particle diameter (μm) | 3.5 | 3.6 | 4.0 | 3.5 | 4.9 | 4.9 |
| Linear thermal expansion coefficient × $10^7$ (0–400° C.) | 78 | 82 | 80 | 75 | 75 | 43 |
| Refractive index (ng) | 1.58 | 1.58 | 1.53 | 1.73 | 1.68 | 1.58 |

TABLE 2

Compositions of organic components used

| Component | B1 | | B2 | | B3 | | B4 | |
|---|---|---|---|---|---|---|---|---|
| Photosensitive monomer | BMEXS-MA | 48% | MPS-MA | 40% | TMPTA | 28% | TMPTA | 28% |
| Photosensitive polymer | polymer 2 | 24% | polymer 2 | 32% | polymer 1 | 44% | polymer 2 | 44% |
| Photopolymerization initiator | MTPMP | 10% | MTPMP | 10% | MTPMP | 10% | MTPMP | 10% |
| | EPA | 6% | EPA | 6% | EPA | 6% | EPA | 6% |
| Ultraviolet ray absorbent | Sudan | 2% | Sudan | 2% | Sudan | 2% | Sudan | 2% |
| Sensitizer | DET | 10% | DET | 10% | DET | 10% | DET | 10% |
| Refractive index (ng)* | | 1.64 | | 1.65 | | 1.56 | | 1.52 |

*: Refractive index of organic component applied over glass substrate and dried at 80° C. for 40 min.

TABLE 3

Results of barrier rib formation

| Pitch/line width | 220 μm · 40 μm | | | 50 μm · 30 μm | | |
|---|---|---|---|---|---|---|
| Coat thickness | 100 μm | 150 μm | 200 μm | 100 μm | 150 μm | 200 μm |
| Example 1 | ◯ | ◯ | ◯ | ◯ | ◯ | ◯ |
| Example 2 | ◯ | ◯ | ◯ | ◯ | ◯ | X |
| Example 3 | ◯ | ◯ | X | ◯ | ◯ | X |
| Example 4 | ◯ | ◯ | X | ◯ | ◯ | X |
| Example 5 | ◯ | ◯ | ◯ | ◯ | ◯ | X |
| Example 6 | ◯ | ◯ | ◯ | ◯ | ◯ | ◯ |
| Example 7 | ◯ | ◯ | ◯ | ◯ | ◯ | ◯ |
| Comparative example 1 | X | X | X | X | X | X |
| Comparative example 2 | X | X | X | X | X | X |

The abbreviations used in the tables are as follows (the numbers given In the formula of Polymers 1–3 shows the molar ratio of each monomer):
  TMPTA: trimethylolpropane tryacrylate
  TBPMA: tribromophenyl methacrylate
  TBB-ADA: tetrabromo-bis-phenol-A diacrylate
  BMEXS-MA:

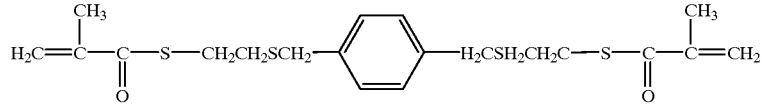

MPS-MA:

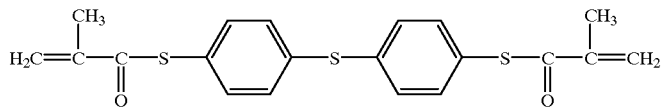

PVA: polyvinyl alcohol
Sudan: red azo dye ($C_{24}H_{20}N_4O$)
Yupinal D50: benzophenone dye (Yupinal D50) $C_{13}H_{10}O_5$
MTPMP: 2-methyl-1-[4-(methylthio)phenyl]-2-morpholinopropane-1
EPA: p-ethyl dimethylaminobenzoate
DET: 2,4-diethylthioxanthone
γ-BL: γ-butyrolactone
Polymer-1:

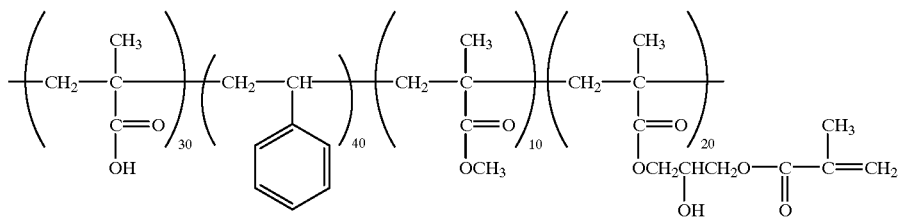

(average molecular weight: 43,000, acid number: 90)

Polymer-2:

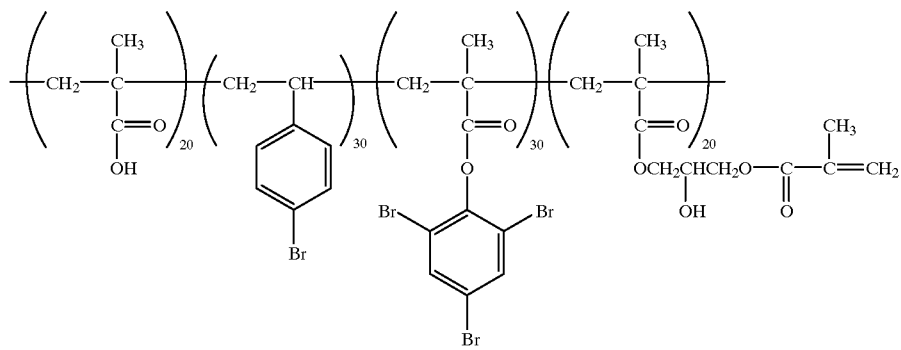

(average molecular weight: 32,000, acid number: 95)

Polymer-3:

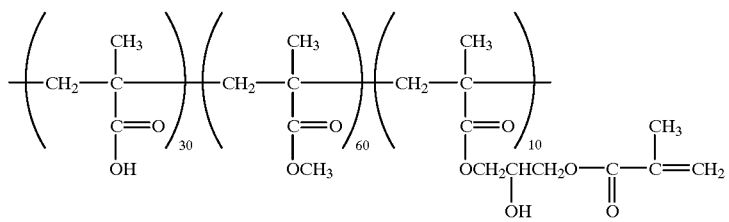

(average molecular weight: 30,000, acid number: 101)

INDUSTRIAL APPLICABILITY

The photosensitive paste of the present invention makes it possible to perform pattern formation with a high aspect ratio and high accuracy. The invention also makes it possible to carry out large-thickness, high-accuracy pattern formation for displays and circuit materials, as well as to enhance the definition and simplify the manufacturing processes. In particular, high-definition plasma display panels can be produced easily.

We claim:

1. A photosensitive paste comprising inorganic particles comprising glass particles and an organic component comprising a photosensitive compound, wherein an average refractive index of the inorganic particles, N1, and an average refractive index of the organic component, N2, satisfy the following equation:

$$-0.1 \leq N2-N1 \leq 0.2,$$

wherein the inorganic particles contain the glass particles at 60 wt.% or more, and wherein the glass particles contain at least one oxide of bismuth or lead and the total content of said at least one oxide is 5–50 wt.%.

2. A photosensitive paste according to claim 1, wherein the average refractive index of the inorganic particles satisfy the following equation:

$$-0.05 \leq N2-N1 \leq 0.1.$$

3. A photosensitive paste comprising inorganic particles comprising glass particles and an organic component comprising a photosensitive compound, wherein an average refractive index of the inorganic particles, N1, and an average refractive index of the organic component, N2, satisfy the following equation:

$$-0.1 \leq N2-N1 \leq 0.2,$$

wherein the inorganic particles contain the glass particles at 60 wt.% or more, and wherein the glass particles contain at least one oxide of bismuth or lead with a total content of said at least one oxide of 5–30 wt.% and wherein the particles also contain at least one additional oxide of lithium, sodium or potassium with a total content of said at least one additional oxide of 3–15 wt.%.

4. A photosensitive paste comprising inorganic particles comprising glass particles and an organic component comprising a photosensitive compound, wherein an average refractive index of the inorganic particles, N1, and an average refractive index of the organic component, N2, satisfy the following equation:

$$-0.1 \leq N2-N1 \leq 0.2,$$

wherein the inorganic particles contain the glass particles at 60 wt.% or more, and wherein the organic component contains 10–90 wt.% of an oligomer or a polymer having a weight-average molecular weight of 500–100,000, which oligomer or polymer has a carboxyl group in the molecular structure.

5. A plasma display panel production method wherein barrier ribs are produced by:

(1) coating a glass substrate with a photosensitive paste and (2) exposing said paste to light, said paste comprising inorganic particles and an organic component comprising a photosensitive compound, wherein an average refractive index of the inorganic particles, N1, and an average refractive index of the organic component, N2, satisfy the following equation:

$$-0.1 \leq N2-N1 \leq 0.2.$$

6. The plasma display panel production method according to claim 5, wherein the light exposure process is performed in one step.

7. A plasma display panel production method according to claim 5, further comprising developing and firing the paste.

8. A plasma display panel production method of claim 5, wherein an average refractive index of the inorganic particles, N1, and an average refractive index of the organic component, N2, satisfy the following equation:

$$-0.05 \leq N2-N1 \leq 0.1.$$

9. A plasma display panel production method of claims 5 or 8, wherein the average refractive index of the inorganic particles is in the range of 1.5–1.7.

10. A plasma display panel production method of claims 5 or 8, wherein the inorganic particles contain 60 wt.% or more of glass particles.

11. A plasma display panel production method of claim 10, wherein the glass particles contain at least one oxide of lithium, sodium or potassium and the total content of said at least one oxide is 3–20 wt.%.

12. A plasma display panel production method of claim 10, wherein the glass particles contain 3–20 wt.% of lithium oxide.

13. A plasma display panel production method of claim 10, wherein the glass particles contain 3–60 wt.% of silicon oxide and 5–50 wt.% of boron oxide.

14. A plasma display panel production method of claim 5 or 8, comprising 50–98 parts by weight of inorganic particles and 5–50 parts by weight of the organic component.

15. A plasma display panel production method according of claims 5 or 8, wherein the average refractive index of the inorganic particles is in the range of 1.55–1.65.

16. A plasma display panel production method of claim 5 or 8, wherein the inorganic particles comprise glass particles containing at least one oxide of bismuth or lead and the total content of said at least one oxide is 5–50 wt.%.

17. A plasma display panel production method of claim 5, wherein the organic component contains 0.05–5 wt.% of a compound that can absorb ultraviolet rays.

18. A plasma display panel production method wherein barrier ribs are produced by:

(1) coating a glass substrate with a photosensitive paste and (2) exposing said paste to light, said paste comprising inorganic particles and an organic component comprising a photosensitive compound, wherein an average refractive index of the inorganic particles is in the range of 1.5–1.7.

19. The plasma display panel production method according to claim 18, wherein the light exposure process is performed in one step.

20. A plasma display panel production method according to claim 18, further comprising developing and firing the paste.

21. A plasma display panel production method of claim 18, wherein an average refractive index of the inorganic particles, N1, and an average refractive index of the organic component, N2, satisfy the following equation:

$$-0.05 \leq N2-N1 \leq 0.1.$$

22. A plasma display panel production method of claim 18, wherein the average refractive index of the inorganic particles is in the range of 1.55–1.65.

23. A plasma display panel production method of claims 18 or 22, wherein the inorganic particles contain 60 wt.% or more of glass particles.

24. A plasma display panel production method of claim 23, wherein the glass particles contain at least one oxide of lithium, sodium or potassium and the total content of said at least one oxide is 3–20 wt.%.

25. A plasma display panel production method of claim 23, wherein the glass particles contain 3–20 wt.% of lithium oxide.

26. A plasma display panel production method of claim 23, wherein the glass particles contain 3–60 wt.% of silicone oxide and 5–50 wt.% of boron oxide.

27. A plasma display panel production method of claims 18 or 22, comprising 50–98 parts by weight of inorganic particles and 5–50 parts by weight of the organic component.

28. A plasma display panel production method of claim 18, wherein the organic component contains 0.05–5 wt.% of a compound that can absorb ultraviolet rays.

29. A photosensitive paste comprising inorganic particles comprising glass particles and an organic component comprising a photosensitive compound, wherein an average refractive index of the inorganic particles is in the range of 1.5–1.7, wherein the inorganic particles contain the glass particles at 60 wt.% or more, and wherein the glass particles contain at least one oxide of bismuth or lead and the total content of said at least one oxide is 5–50 wt.%.

30. A photosensitive paste according to claim 29, wherein the average refractive index of the inorganic particles is in the range of 1.55–1.65.

31. A photosensitive paste comprising inorganic particles comprising glass particles and an organic component comprising a photosensitive compound, wherein an average refractive index of the inorganic particles is in the range of 1.5–1.7, wherein the inorganic particles contain the glass particles at 60 wt.% or more, and wherein the glass particles contain at least one oxide of bismuth or lead with a total content of said at least one oxide of 5–30 wt.% and wherein the particles also contain at least one additional oxide of lithium, sodium or potassium with a total content of said at least one additional oxide of 3–15 wt.%.

32. A photosensitive paste comprising inorganic particles comprising glass particles and an organic component comprising a photosensitive compound, wherein an average refractive index of the inorganic particles is in the range of 1.5–1.7, wherein the inorganic particles contain the glass particles at 60 wt.% or more, and wherein the organic component contains 10–90 wt.% of an oligomer or a polymer having a weight-average molecular weight of 500–100,000, which oligomer or polymer has a carboxyl group in the molecular structure.

* * * * *